United States Patent [19]

Chemla et al.

[11] Patent Number: 4,749,850
[45] Date of Patent: Jun. 7, 1988

[54] HIGH SPEED QUANTUM WELL OPTICAL DETECTOR

[75] Inventors: Daniel S. Chemla, Rumson; David A. B. Miller, Fair Haven; Stefan N. Schmitt-Rink, Watchung, all of N.J.

[73] Assignee: American Telephone and Telegraph Company, Murray Hill, N.J.

[21] Appl. No.: 43,213

[22] Filed: Apr. 27, 1987

[51] Int. Cl.[4] .............................................. H01J 40/14
[52] U.S. Cl. .................................. 250/211 J; 357/24
[58] Field of Search ................ 250/211 R, 211 J, 578; 365/109, 110, 112; 357/38, 30 R, 24 LR

[56] References Cited

U.S. PATENT DOCUMENTS 3,917,943  11/1975  Auston ............................. 250/211 J
4,494,132   1/1985  Kohn ...................................... 357/30
4,525,687   6/1985  Chemla .............................. 332/7.51
4,546,244  10/1985  Miller ................................. 250/211

Primary Examiner—David C. Nelms
Attorney, Agent, or Firm—Gregory C. Ranieri

[57] ABSTRACT

In response to ultrafast optical signal pulses, it is now possible to generate correspondingly ultrafast electrical signal pulses by employing semiconductor apparatus including at least one quantum well layer electrically biased by a static electric field. Optical signal pulses incident on the quantum well are at a wavelength substantially less than the absorption edge of the quantum well layer or layers. In other words, the incident optical pulses have a means photon energy less than the bandgap energy of the quantum well layer or layers. The electrical signal pulse generated subsists for a period of time substantially equal to the duration of the optical signal pulses incident on the quantum well layer or layers.

8 Claims, 1 Drawing Sheet

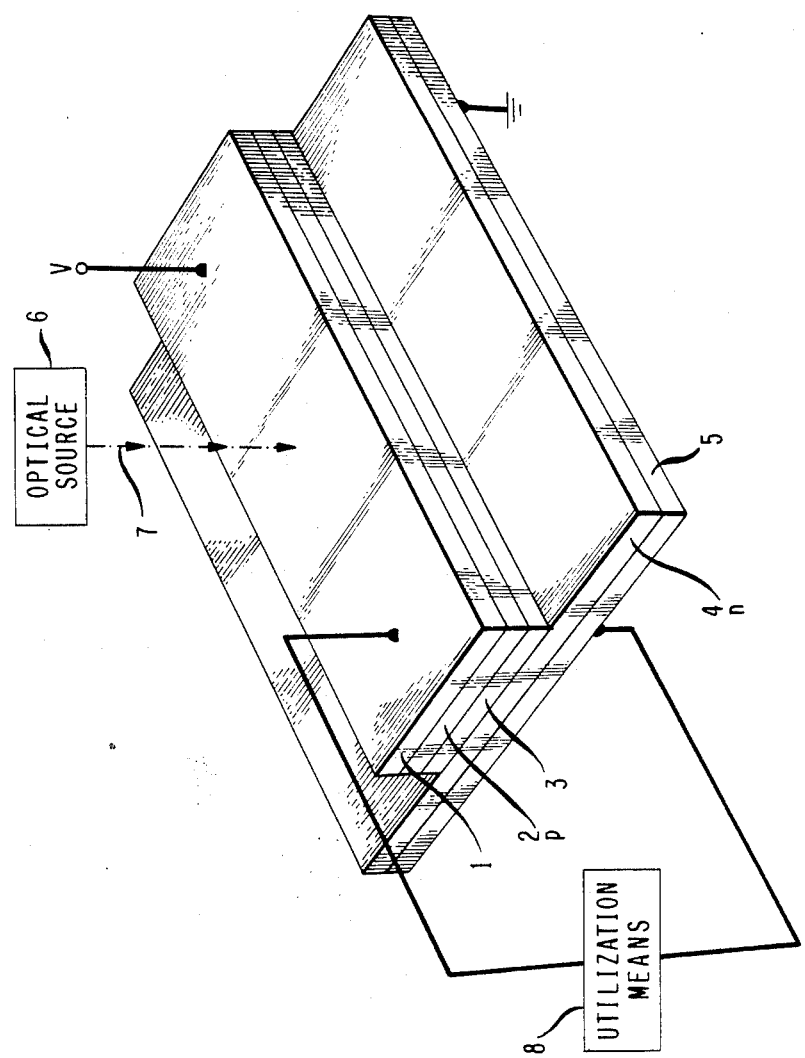

HIGH SPEED QUANTUM WELL OPTICAL DETECTOR

TECHNICAL FIELD

This invention relates to the field of semiconductor devices and, more particularly, to optoelectronic semiconductor devices employing quantum well layers.

BACKGROUND OF THE INVENTION

Single and multiple quantum well layer structures have become increasingly important in the areas of optical communication systems and optical computing systems. These structures exhibit linear and nonlinear properties which permit them to be used as logic elements in switching system applications as well as modulation, detection and gain elements in comunication system applications. See, for example, U.S. Pats. Nos. 4,525,687 and 4,546,244.

In general, these device structures operate on an absorption principle. That is, the device is illuminated by a light beam from an external source at an optical wavelength at or above the absorption edge of the quantum wells. By electrically manipulating the absorption edge of the quantum well material, it is possible to absorb or transmit the light incident on the device. When the light is absorbed in the quantum wells, a voltage may be generated by the photovoltaic effect. Absorbed photons generate mobile charge carriers that move under the action of an applied electric field. Movement of the charge carriers changes the electric field and, thereby, generates a change in voltage. This mode of operation is useful in generating a steady current provided that the light is selected to have a wavelength that is strongly and continuously absorbed by the quantum wells, i.e., the photon energy of the incident light is at or above the bandgap energy of the quantum wells. While this mode of device operation is useful for detecting relatively long optical signal pulses, it severely limits the applicability of the device to very high speed optical pulse detection, among other things, because of the persistence of the absorption induced photovoltage long after the extinction of a high speed (short) optical signal pulse.

SUMMARY OF THE INVENTION

In response to ultrafast optical signal pulses, it is now possible to generate correspondingly ultrafast electrical signal pulses ($\approx 100$fs) by employing semiconductor apparatus including at least one quantum well layer electrically biased by a static electric field. Optical signal pulses incident on the quantum well are at a wavelength substantially less than the absorption edge of the quantum well material. In other words, the incident optical pulses have a mean photon energy less than the bandgap energy of the quantum well layer or layers. A significant fraction of the electrical signal pulse generated subsists for a period of time substantially equal to the duration of the optical signal pulses incident on the quantum well layer or layers.

BRIEF DESCRIPTION OF THE DRAWING

A more complete understanding of the invention may be obtained by reading the following description of a specific illustrative embodiment of the invention in conjunction with the appended drawing in which the FIGURE is a system diagram of semiconductor apparatus in accordance with the principles of the invention.

DETAILED DESCRIPTION

The FIGURE shows one embodiment of the invention in which an optical signal is incident upon at least one semiconductor quantum well layer for generating a change in the resulting electric field. In general, a bias field is applied perpendicular to the quantum well layer or layers. The incident optical signal may enter the quantum well or wells from any direction and in any polarization provided that the optical signal can propagate in the quantum well or wells. It should be noted that the semiconductor device shown in the FIGURE is not drawn to scale.

In one embodiment, the semiconductor quantum well layer is included in the intrinsic (i) layer of a p-i-n detector. Electrode 1 is positioned on an exposed surface of p-type semiconductor layer 2. It is preferable that electrode 1 be a semi-transparent metallic layer to permit passage of optical signals incident thereupon. P-type semiconductor layer 2 is positioned on intrinsic layer 3 which includes one or more quantum well layers. Intrinsic layer 3 is likewise positioned on n-type semiconductor layer 4. N-type semiconductor layer 4 is positioned on electrode 5 which is generally fabricated from metallic materials. For the embodiment shown in the FIGURE, electrode 5 serves as a metallic ground plane and the combination of electrodes 1 and 5 acts as a stripline transmission medium.

In an example from experimental practice, p-type semiconductor layer 2 includes p-doped AlGaAs; n-type semiconductor layer 4 includes n-doped AlGaAs; and intrinsic layer 3 includes one or more quantum well layers approximately 100 angstroms thick. In this material system, a single quantum well layer may include either GaAs or AlGaAs. Multiple quantum well layers in intrinsic layer 3 may include alternating thin layers of AlGaAs and GaAs. Semiconductor structures of this type are generally grown by epitaxial growth techniques described in U.S. Pat. Nos. 3,982,207, 4,205,329, and 4,261,771 as well as in the reference book by Casey and Panish, "Heterostructure Lasers Part B: Materials and Operating Characteristics," Pages 71–155 (Academic Press, New York: 1978).

Optical source 6 generates optical signal 7 at a wavelength below the wavelength corresponding to the absorption edge of the quantum well layer or layers in intrinsic layer 3. In other words, the mean photon energy of optical signal 7 is less than the band gap energy of the quantum well layer or layers in intrinsic layer 3. In an example from experimental practice, optical source 6 is a conventional pulsed dye laser capable of producing an optical signal pulse of approximately 100 pJ of energy and several hundred femtoseconds duration in an optical spot of area approximately 4 $\mu m^2$.

Utilization means 8 is connected to electrodes 1 and 5 of the semiconductor device to receive electrical signals generated therefrom. In an example from experimental practice, utilization means 8 may be realized as any electronic or optoelectronic or other sensing device (e.g., transistor or quantum well device) which is capable of responding to the electrical pulse signals.

For the arrangement shown in the FIGURE, optical signal 7 incident upon intrinsic layer 3 and having a mean photon energy below the band gap energy of the quantum well in intrinsic layer 3 induces a change of the electric field perpendicular to the layers 3, 4, and 5. The induced change in electric field decays instantaneously when the intense optical signal 7 is extinguished, thereby permitting extremely high speed photo detection. It should be noted that the p-i-n semiconductor structure shown in the FIGURE is subject to an applied reversed bias potential of magnitude V volts. As such, optical signal 7 incident on quantum well layers in intrinsic layer 3 causes corresponding voltage pulses to propagate on the transmission line formed by electrodes 1 and 5. These voltage pulses are supplied to utilization means 8.

While it has been shown in the FIGURE that the electric field is supplied from an external source, it is now well known that electric fields of sufficient strength ($10^5$V/cm) occur in strained layer superlattice quantum wells via piezoelectric effects and built-in strain mechanisms. See, for example, C. Mailhiot and D.L. Smith, J. Vac. Sci. Technol. B4, 996 (1986).

It is expected that the principles of this invention are applicable not only to the photodetector illustratively embodied in the FIGURE but also to other devices such as optical isolators, optoelectronic transducers, and other photonic switching applications. For example, the device can be used in producing fieldinduced four wave mixing. That is, an electric field "grating" created in the quantum well layer by two interfering optical signals generate a refractive index grating through quantum confined stark effect electrorefraction and, thereby, causes scattering of a third optical signal off the grating to generate a fourth optical signal.

What is claimed is:

1. Semiconductor apparatus including at least one semiconductor quantum well layer, means for applying an electrical potential to said at least one semiconductor quantum well layer, and a source of an optical signal, said semiconductor apparatus CHARACTERIZED IN THAT the mean photon energy of said optical signal is less than the band gap energy of said at least one semiconductor quantum well layer, and said at least one semiconductor quantum well layer is responsive to said optical signal to induce a change in the electric field there across, the change of said electric field subsisting for a period substantially equal to the duration of said optical signal.

2. The apparatus as defined in claim 1 wherein the semiconductor apparatus further includes means for translating an electromagnetic signal representative of the change of said electric field to an output of said semiconductor apparatus.

3. The apparatus as defined in claim 2 wherein said translating means includes a stripline transmission medium.

4. The apparatus as defined in claim 1 wherein said means for applying an electrical potential includes means for translating a electromagnetic signal representative of the change of said electric field to an output of said semiconductor apparatus.

5. The apparatus as defined in claim 4 wherein said translating means includes a stripline transmission means.

6. The apparatus as defined in claim 1 further including means responsive to the change in said electric field for varying a predetermined optical property thereof.

7. The apparatus as defined in claim 6 wherein the semiconductor apparatus further includes means for translating an electromagnetic signal representative of the change of said electric field to an output of said semiconductor apparatus.

8. The apparatus as defined in claim 1 wherein said at least one quantum well layer is also responsive to the change in said electric field for varying a predetermined optical property thereof.

* * * * *

UNITED STATES PATENT AND TRADEMARK OFFICE
CERTIFICATE OF CORRECTION

PATENT NO.  : 4,749,850
DATED       : June 7, 1988
INVENTOR(S) : Daniel S. Chemla, David A. B. Miller, Stefan N. Schmitt-Rink It is certified that error appears in the above-identified patent and that said Letters Patent is hereby corrected as shown below:

On The Title Page:

(73) Assignee: "American Telephone and Telegraph Company, Murray Hill, N.J." should read -- American Telephone and Telegraph Company, AT&T Bell Laboratories, Murray Hill, N.J. --.

Signed and Sealed this

Eighth Day of November, 1988

*Attest:*

DONALD J. QUIGG

*Attesting Officer*  *Commissioner of Patents and Trademarks*